(12) United States Patent
Seddon

(10) Patent No.: US 11,823,953 B2
(45) Date of Patent: *Nov. 21, 2023

(54) SEMICONDUCTOR SUBSTRATE PROCESSING METHODS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 17/444,938

(22) Filed: Aug. 12, 2021

(65) Prior Publication Data

US 2021/0375679 A1    Dec. 2, 2021

Related U.S. Application Data

(63) Continuation of application No. 15/986,460, filed on May 22, 2018, now Pat. No. 11,121,035.

(51) Int. Cl.
    *H01L 21/78*    (2006.01)
    *H01L 21/04*    (2006.01)
    *H01L 29/16*    (2006.01)

(52) U.S. Cl.
    CPC .......... *H01L 21/78* (2013.01); *H01L 21/0475* (2013.01); *H01L 29/1608* (2013.01)

(58) Field of Classification Search
    None
    See application file for complete search history.

(56) References Cited

U.S. PATENT DOCUMENTS

| | | | |
|---|---|---|---|
| 9,481,051 B2 | 11/2016 | Hirata et al. | |
| 9,620,415 B2 | 4/2017 | Hirata et al. | |
| 9,808,884 B2 | 11/2017 | Hirata et al. | |
| 9,815,138 B2 | 11/2017 | Hirata | |
| 9,868,177 B2 | 1/2018 | Hirata | |
| 9,878,397 B2 | 1/2018 | Hirata et al. | |
| 2004/0145751 A1* | 7/2004 | Binnard | G01B 9/02027 356/500 |

(Continued)

FOREIGN PATENT DOCUMENTS

| | | |
|---|---|---|
| JP | 2001-341122 A | 12/2001 |
| JP | 2016-146446 A | 8/2016 |

(Continued)

*Primary Examiner* — Khaja Ahmad
(74) *Attorney, Agent, or Firm* — Adam R. Stephenson, LTD.

(57) ABSTRACT

Implementations of a method of forming a plurality of semiconductor devices on a semiconductor substrate may include: providing a semiconductor substrate having a first surface, a second surface, a size, and a thickness where the second surface opposes the first surface and the thickness is between the first surface and the second surface. The method may include processing the semiconductor substrate through a plurality of semiconductor device fabrication processes to form a plurality of semiconductor devices on the first surface. The thickness may be between 100 microns and 575 microns and the size may be 150 mm. The semiconductor substrate may not be coupled with a carrier or support.

17 Claims, 1 Drawing Sheet

(56) References Cited

U.S. PATENT DOCUMENTS

| | | | |
|---|---|---|---|
| 2008/0290482 A1 | 11/2008 | Bayan et al. | |
| 2009/0017600 A1* | 1/2009 | Kirihara | H01L 21/78 |
| | | | 257/E21.238 |
| 2009/0203193 A1 | 8/2009 | Morikazu et al. | |
| 2014/0065801 A1* | 3/2014 | Faurie | H01L 21/02579 |
| | | | 438/478 |
| 2015/0364394 A1 | 12/2015 | Lin | |
| 2016/0228984 A1 | 8/2016 | Hirata et al. | |
| 2016/0228985 A1 | 8/2016 | Tirata et al. | |
| 2016/0260763 A1* | 9/2016 | Shimotsusa | H01L 31/024 |
| 2016/0288250 A1 | 10/2016 | Tirata et al. | |
| 2016/0288251 A1 | 10/2016 | Hirata et al. | |
| 2016/0293397 A1 | 10/2016 | Hirata et al. | |
| 2016/0305042 A1 | 10/2016 | Hirata | |
| 2016/0307763 A1 | 10/2016 | Hirata | |
| 2016/0354862 A1 | 12/2016 | Hirata | |
| 2017/0015017 A1 | 1/2017 | Hirata | |
| 2017/0025275 A1 | 1/2017 | Hirata et al. | |
| 2017/0025276 A1 | 1/2017 | Hirata | |
| 2017/0053829 A1 | 2/2017 | Hirata et al. | |
| 2017/0066078 A1 | 3/2017 | Morikazu et al. | |
| 2017/0136572 A1 | 5/2017 | Hirata | |
| 2017/0151627 A1 | 6/2017 | Hirata | |
| 2017/0198411 A1 | 7/2017 | Hirata | |
| 2017/0291255 A1 | 10/2017 | Hirata | |
| 2017/0345716 A1* | 11/2017 | Brunnbauer | H01L 21/78 |
| 2017/0348796 A1 | 12/2017 | Nishino et al. | |
| 2017/0352781 A1 | 12/2017 | Obuchi et al. | |

FOREIGN PATENT DOCUMENTS

| | | |
|---|---|---|
| JP | 2016-146447 A | 8/2016 |
| JP | 2016-146448 A | 8/2016 |
| JP | 2016-151457 A | 8/2016 |
| JP | 2016-197698 A | 11/2016 |
| JP | 2016-197699 A | 11/2016 |
| JP | 2016-197700 A | 11/2016 |
| JP | 2016-198788 A | 12/2016 |
| JP | 2016-207702 A | 12/2016 |
| JP | 2016-207703 A | 12/2016 |
| JP | 2016-225535 A | 12/2016 |
| JP | 2016-225536 A | 12/2016 |
| JP | 2017-005008 A | 1/2017 |
| JP | 2017-022283 A | 1/2017 |
| JP | 2017-024014 A | 2/2017 |
| JP | 2017-024039 A | 2/2017 |
| JP | 2017-024188 A | 2/2017 |
| JP | 2017-028072 A | 2/2017 |
| JP | 2017-041481 A | 2/2017 |
| JP | 2017-041482 A | 2/2017 |
| JP | 2017-057103 A | 3/2017 |
| JP | 2017-092314 A | 5/2017 |
| JP | 2017-121742 A | 7/2017 |
| JP | 2017-123405 A | 7/2017 |
| JP | 2017-188586 A | 10/2017 |
| JP | 2017-189870 A | 10/2017 |
| JP | 2017-215303 A | 12/2017 |
| JP | 2017-216423 A | 12/2017 |
| JP | 2017-216424 A | 12/2017 |
| JP | 2017-220631 A | 12/2017 |

* cited by examiner

SEMICONDUCTOR SUBSTRATE PROCESSING METHODS

CROSS REFERENCE TO RELATED APPLICATIONS

This application is a continuation application of the earlier U.S. Utility patent application to Seddon entitled "Semiconductor Substrate Processing Methods," application Ser. No. 15/986,460, filed May 22, 2018, now pending, the disclosure of which is hereby incorporated entirely herein by reference.

BACKGROUND

1. Technical Field

Aspects of this document relate generally to methods for forming semiconductor devices. More specific implementations involve semiconductor devices formed on semiconductor substrates.

2. Background

Semiconductor devices are generally formed on a substrate material that itself is a semiconductor material. Silicon is a frequently used semiconductor material that is utilized as a semiconductor substrate. Silicon substrates are often doped to aid in forming the semiconductor devices.

SUMMARY

Implementations of a method of forming a plurality of semiconductor devices on a semiconductor substrate may include: providing a semiconductor substrate having a first surface, a second surface, a size, and a thickness where the second surface opposes the first surface and the thickness is between the first surface and the second surface. The method may include processing the semiconductor substrate through a plurality of semiconductor device fabrication processes to form a plurality of semiconductor devices on the first surface. The thickness may be between 70 microns and 500 microns and the size may be 100 mm. The semiconductor substrate may not be coupled with a carrier or support.

Implementations of method of forming a plurality of semiconductor devices may include one, all, or any of the following:

The method may include backgrinding the second surface of the semiconductor substrate to reduce the thickness to a desired value.

The method may further include singulating the semiconductor substrate to singulate the plurality of semiconductor devices.

The method may further include not backgrinding the second surface of the semiconductor substrate.

Providing the semiconductor substrate may further include forming the semiconductor substrate from a boule and grinding or polishing the first surface or the second surface of the semiconductor substrate to thin the thickness to between 70 microns and 500 microns.

Providing the semiconductor substrate may further include forming the semiconductor substrate from a boule with the thickness between 70 microns and 500 microns and grinding or polishing the first surface or the second surface to not substantially thin the thickness.

The thickness may be between 70 microns and 500 microns during each of the plurality of semiconductor device fabrication processes.

Implementations of a method of forming a plurality of semiconductor devices on a semiconductor substrate may include providing a semiconductor substrate including a first surface, a second surface, a size, and a thickness where the second surface opposes the first surface and the thickness is between the first surface and the second surface. The method may include processing the semiconductor substrate through a plurality of semiconductor device fabrication processes to form a plurality of semiconductor devices on the first surface. The thicknesses may be between 100 microns and 575 microns and the size may be 150 mm. The semiconductor substrate may not be coupled with a carrier or a support.

Implementations of method of forming a plurality of semiconductor devices may include one, all, or any of the following:

The method may include backgrinding the second surface of the semiconductor substrate to reduce the thickness to a desired value.

The method may include singulating the semiconductor substrate to singulate the plurality of semiconductor devices.

The method may include not backgrinding the second surface of the semiconductor substrate.

Providing the semiconductor substrate may further include forming the semiconductor substrate from a boule and grinding or polishing the first surface or the second surface of the semiconductor substrate to thin the thickness to between 100 microns and 575 microns.

Providing the semiconductor substrate may include forming the semiconductor substrate from a boule with the thickness between 100 microns and 575 microns and grinding or polishing the first surface or the second surface to not substantially thin the thickness.

The thickness may be between 100 microns and 575 microns during each of the plurality of semiconductor device fabrication processes.

Implementations of a method of forming a plurality of semiconductor devices on a semiconductor substrate may include providing a semiconductor substrate including a first surface, a second surface, and a thickness where the second surface opposes the first surface and the thickness is between the first surface and the second surface. The method may include processing the semiconductor substrate through a plurality of semiconductor device fabrication processes to form a plurality of semiconductor devices on the first surface. The thickness may be between 120 microns and 600 microns and the size may be 200 mm. The semiconductor substrate may not be coupled with a carrier or a support.

Implementations of method of forming a plurality of semiconductor devices may include one, all, or any of the following:

The method may further include backgrinding the second surface of the semiconductor substrate to reduce the thickness to a desired value.

The method may further include singulating the semiconductor substrate to singulate the plurality of semiconductor devices.

The method may further include not backgrinding the second surface of the semiconductor substrate.

Providing the semiconductor substrate may further include forming the semiconductor substrate from a boule and grinding or polishing the first surface or the second surface to thin the thickness to between 120 microns and 600 microns.

The thickness may be between 120 microns and 600 microns during each of the plurality of semiconductor device fabrication processes.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor substrate processing methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor substrate processing methods, and implementing components and methods, consistent with the intended operation and methods.

Figure 1:
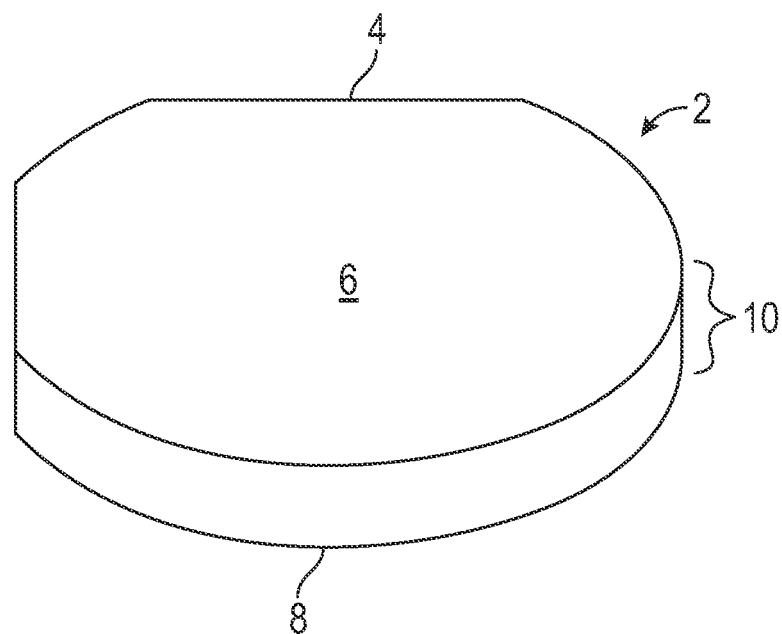
FIG. 1 is a perspective view of a semiconductor substrate prior to semiconductor device processing.

Referring to FIG. 1, an implementation of a semiconductor substrate 2 is illustrated in a perspective view. The particular type of semiconductor substrate illustrated in FIG. 1 is a silicon carbide substrate with two flats. As illustrated, the substrate 2 includes a first surface 6 (planar surface) and a second surface (planar surface) 8 that opposes the first surface 6. As illustrated, the first surface 6 and second surface 8 are the largest planar surfaces of the substrate 2. Between the first surface 6 and the second surface 8 is the thickness 8 of the substrate. The first surface 6 and second surface 8 have a perimeter 4, which in the implementation illustrated in FIG. 1 includes two flats. In various implementations, however, no flats may be included, only one flat may be included, or a wafer notch may be used for orienting the substrate. In other implementations, no flats or notches may be used so that the substrate may be circular. The perimeter 4 of the substrate 2 may be any closed shape in various implementations, including, by non-limiting example, circular, elliptical, square, rectangular, irregular, or any other closed shape.

A wide variety of semiconductor substrates may be utilized in various method implementations disclosed herein which demonstrate sufficient mechanical strength, including, by non-limiting example, single crystal silicon; silicon dioxide; glass; silicon-on-insulator; gallium arsenide; sapphire; ruby; silicon carbide; single crystal, polycrystalline, or amorphous forms of any of the foregoing; and any other substrate type useful for constructing semiconductor devices. Particular implementations disclosed herein may utilize silicon carbide (SiC) semiconductor substrates and boules (silicon carbide substrates and boules), including any polytype of SiC. There are over 250 different polytypes of SiC including the 3C—SiC, 4H—SiC, and 6H—SiC polytypes, any of which may be used in various implementations disclosed in this document. In this document the term "semiconductor substrate" is also used along with "wafer" as a wafer is a common type of substrate, but not as an exclusive term that is used to refer to all semiconductor substrate types.

In various implementations, SiC semiconductor substrates, such as a single crystal SiC semiconductor substrate, do not have a cubic crystalline lattice, but rather have a non-cubic crystalline lattice, such as a hexagonal crystalline lattice. The direction of the lateral step flow growth of the SiC single crystal crystalline lattice is non-parallel to the largest planar surface of the semiconductor substrate (first surface 6). In particular implementations, because of the non-cubic crystalline lattice (which may be hexagonal in the case of SiC), the crystal plane is formed in the same direction as the direction of the lateral step flow growth. Because of this, the crystal plane for SiC is not parallel to the largest planar surface of the semiconductor substrate (first surface 6) but is slightly angled at substantially four degrees relative to the plane of the semiconductor substrate (the "off angle"). This angle can vary depending on how the particular boule is grown and the characteristics of the seed crystal used for growing the boule between about one degree to about six degrees in various implementations. In various implementations, the off angle may be about 4 degrees. In various implementations, this angle is determined at the time the boule is manufactured.

Various processes may be used to create silicon carbide substrates from a boule of silicon carbide material. Because of the high hardness of silicon carbide (9-9.5 on the Mohs hardness scale), cutting and singulating silicon carbide is more difficult than for other semiconductor substrate types (silicon, gallium arsenide, ruby, sapphire, etc.). In some implementations, wire or other sawing is used to singulate the silicon carbide. In other implementations, laser irradiation to form internal damage to the material of the silicon carbide boule followed by ultrasonic/megasonic treatment of the laser irradiated boule to separate each substrate followed by backgrinding/polishing/lapping operations to polish the surface of the silicon carbide substrate may be used. In other implementations, a material may be adhered to the surface of the boule and then rapidly thermally cooled using liquid nitrogen, causing a thermal shock to the material of the boule and resulting in a silicon carbide substrate to separate from the boule. Each of the various methods that may be used to singulate silicon carbide substrates from the boule may be adjusted/tuned/adapted to produce silicon carbide substrates of varying thicknesses depending on the requirements. Each of these methods also requires a certain amount of backgrinding/polishing/lapping to be done to the surface(s) of each silicon carbide substrate following separate to flatten and polish the surface of the substrate to the degree needed for subsequent fabrication operations.

The thickness of a semiconductor substrate is a function of the size of the substrate. For example, for silicon substrates, Table 1 lists the standard thickness of the substrate for each wafer size. For six, eight, and twelve inch silicon wafers, the actual wafer size is not measured in inches directly (mm instead) and the approximate size in mm is indicated in parenthesis in Table 1.

TABLE 1

| Size (inches) | Thickness (microns) |
|---|---|
| 1 | 275 |
| 2 | 375 |

TABLE 1-continued

| Size (inches) | Thickness (microns) |
|---|---|
| 3 | 375 |
| 4 (100 mm) | 525 |
| 5 | 625 |
| 6 (150 mm) | 675 |
| 8 (200 mm) | 725 |
| 12 (300 mm) | 775 |

The wafer thickness at a given wafer size is a function of the material properties of the semiconductor material that relate to its mechanical strength, such as, by non-limiting example, yield strength, compressive strength, tensile strength, fatigue strength, impact strength, ultimate strength, Young's modulus, Poisson's ratio, and any other material parameter influencing mechanical strength of the material. Silicon wafers thinner than the thicknesses in Table 1 have been observed to exhibit the effects of insufficient mechanical strength to undergo fabrication processing steps without being bonded to a carrier or other support during fabrication operations. These include wafer deflection, wafer cracking, wafer chipping, wafer breakage when localized vacuum force is applied (such as during wafer handling/transport operations) and other negative processing characteristics. Attempting to process silicon wafers thinner than the standardized thicknesses for silicon introduces risks of wafer breakage and yield loss as the effects of wafer deflection and reduced wafer strength take their toll as the wafers can be damaged or lost as they are handled and processed through the various fab processing equipment systems (fabrication tools).

Any semiconductor substrate type that has sufficient mechanical strength at a given thickness could be used for processing through the entire semiconductor fabrication process (or portions thereof) at a desired wafer size using the method implementations disclosed herein. In order to facilitate the mechanical processing of the thinner wafers, however, fab tools normally configured for regular thickness silicon wafers would need to be configured for thinner semiconductor substrates that are the same wafer size as the silicon wafers. The nature of the configuration would depend on the particular fab tool involved, but may involve, by non-limiting example, calibrating wafer detection systems used for scanning wafer cassettes, adjusting vacuum levels, adjusting lithographic machine parameters with the new thickness, testing wafer handling robotics, adjusting wafer detection systems on wafer handling robotics, and any other tool function/parameters affecting detection of or handling of the substrate.

As a non-limiting example of a semiconductor substrate that can be processed through semiconductor device fabrication processes with a thinner thickness than the same sized silicon substrate, silicon carbide has higher mechanical strength than silicon through the various observed material properties that its mechanical strength. Because of this, silicon carbide, when formed into a planar semiconductor substrate, demonstrates equivalent substrate mechanical strength to, for example, a silicon substrate, but at a thinner thickness than that of the silicon substrate. Because of this, silicon carbide substrates that are thinner than a comparably sized silicon substrate are capable of being mechanically processed through the same fab tools and operations during semiconductor device fabrication.

The particular thickness of the silicon carbide substrates that may be processed through a semiconductor device fabrication process will depend on the size of the substrate. However, because silicon carbide has higher mechanical strength than silicon, the thickness of the silicon carbide substrates may not vary as much with the size of the substrate when compared with the silicon substrates in Table 1. Table 2 includes a list of ranges of thicknesses for silicon carbide substrates by wafer size.

TABLE 2

| Size (inches) | Thickness (microns) |
|---|---|
| 4 (100 mm) | 70-500 |
| 5 | 85-520 |
| 6 (150 mm) | 100-575 |
| 8 (200 mm) | 120-600 |

For a four inch (100 mm) circular silicon carbide substrate with two flats, sufficient mechanical strength for processing through semiconductor device has been observed for substrates from about 70 microns to about 500 microns. In some implementations, sufficient mechanical strength has been observed for 100 mm wafers less than 200 microns in thickness. If carriers are employed, the following minimum thicknesses could be used: for 4 inch SiC wafers, about 50 microns; for 5 inch SiC wafers, about 50; for 6 inch SiC wafers, about 60 microns; and for 8 inch SiC wafers, about 70 microns.

In various method implementations, the method includes providing a semiconductor substrate with a thickness not greater than 200 microns (200 microns or less), and processing the semiconductor substrate through a plurality of semiconductor device fabrication processes to form a plurality of semiconductor devices on/in the first surface of the substrate. The processing takes place while the semiconductor substrate is not coupled with a carrier or support, such as, by non-limiting example, a carrier wafer, a carrier substrate, a ring formed through backgrinding the wafer (Taiko ring), a ring bonded to the wafer, carrier tape, or any other carrier or support device couplable with the wafer and/or formed from the wafer material itself. The semiconductor device fabrication processes may by any designed to assist in forming a semiconductor device, including, by non-limiting example, deposition processes, etching processes, photolithographic processes, planarization processes, coating processes, implantation processes, doping processes, chemical vapor deposition processes, sputtering processes, evaporation processes, wet etching processes, dry etching processes, electrical testing processes, visual inspection processes, microscopic inspection processes, metrology processes, testing processes, and any other process that may be used in the formation of a semiconductor device. In various implementations, these processes may be carried out in various sequential process steps carried out using one or more types of fabrication tools.

Figure 2:
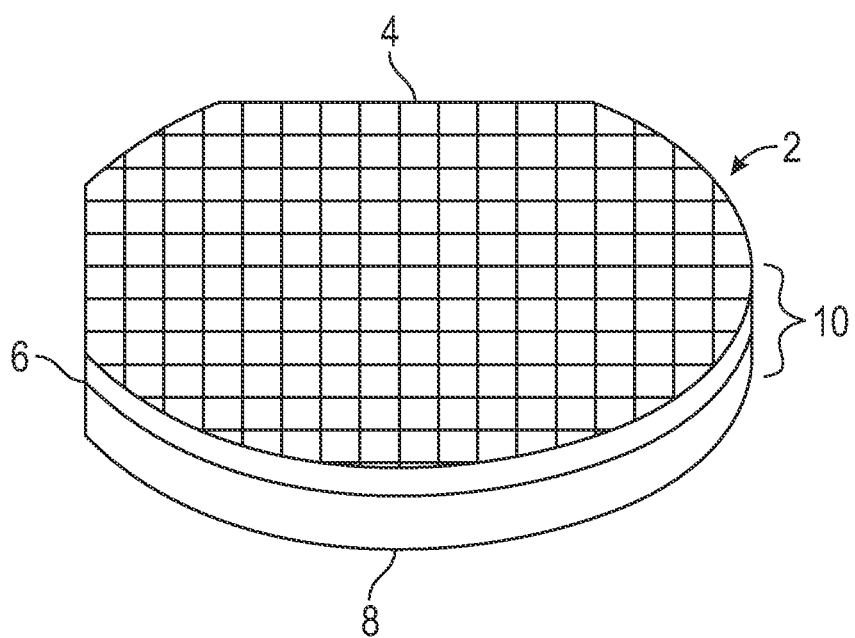
FIG. 2 is a perspective view of the substrate of FIG. 1 following semiconductor device processing and prior to singulation and packaging operations.

Referring to FIG. 2, the substrate 2 of FIG. 1 is illustrated with the plurality of semiconductor devices formed on the first surface 6 of the substrate 2. As previously discussed, the substrate 2 has perimeter 4 and the thickness of the substrate itself exists between the first surface 6 and the second surface 8 (substrate backside). As illustrated, in various implementations, the materials that form the semiconductor devices may extend upwardly above the first surface 6 of the substrate 2, forming a layer of various materials on the surface of the first surface 6. However, this layer does not affect the actual thickness 10 of the substrate material itself. For example, if the finished thickness of a 200 micron thick substrate with the devices thereon was 206 microns, the actual thickness of the substrate material itself is still 200 microns, meaning the semiconductor processing added 6 microns to the finished thickness of the substrate. As used herein, the term "thickness" refers to the thickness of the material of semiconductor substrate itself rather than the distance between the first and second surfaces of the substrate observed after completion of or during device fabrication processing. In various implementations, the thickness may not change throughout the entire plurality of semiconductor device fabrication processes. In these implementations, the semiconductor substrate is processed through every process step and tool at a thicknesses of no greater than 200 microns. In other implementations, however, the semiconductor substrate may be processed through only a portion of the process steps and tools at the thickness of no greater than 200 microns (or the range of thicknesses corresponding with the size of the wafer disclosed in Table 2).

In various method implementations, the method may include backgrinding the second surface of the semiconductor substrate to reduce the thickness of the substrate to a desired value. In some implementations, backgrinding may be employed to allow the wafer to be thinned even further from its original processing for various reasons relevant to the use and/or packaging of the semiconductor device, including, by non-limiting example, heat transfer improvements, electrical performance improvements, package form factor size reduction, and any other use or packaging characteristic or feature. However, in other implementations, backgrinding may not be used, as the thickness of the silicon substrate may already be that needed to produce the desired use and/or packaging effects for the semiconductor devices formed.

In various method implementations, the semiconductor substrate is singulated after the fabrication processes have been completed. The singulation may be carried out through a wide variety of methods, including, by non-limiting example, sawing, laser cutting/scribing, water jet cutting, scribing and breaking, and any other method and/or system designed to separate the semiconductor devices from each other.

In various method implementations, the semiconductor substrate may be formed from a boule using any process disclosed in this document and then the first surface and/or second surface of the substrate may be ground/background and/or polished to thin the thickness to the range of thicknesses corresponding with the size of the wafer disclosed in Table 2. In other implementations however, the grinding/backgrinding and/or polishing process may not be used to substantially thin the thickness but may be used simply to flatten and/or create the desired surface uniformity for the first surface and/or second surface of the substrate.

In various method implementations like those already disclosed herein, the thickness of the substrate may be less than 600 microns. In particular implementations, the thickness may be no greater than 575 microns (575 microns or less). In other particular implementations, the thickness may be no greater than 500 microns (500 microns or less). These thinner thickness substrates may be created from a boule using any of the methods disclosed herein and processed through the plurality of semiconductor device fabrication processes at the appropriate wafer size based on the mechanical strength of the particular substrate. In various implementations, silicon carbide substrates of 600 micron thickness or less, 575 micron thickness or less, or 500 micron thickness or less may be utilized in various method implementations to form semiconductor devices thereon. In these implementations, these substrates may be processed through all of the plurality of semiconductor process steps at these thicknesses or, in some implementations, may be processed through only a portion of the process steps at these thicknesses. Those of ordinary skill in the art will readily be able to select the appropriate thickness for a semiconductor substrate for processing through a plurality of semiconductor fabrication processes using the principles disclosed herein.

In places where the description above refers to particular implementations of semiconductor substrate processing methods and implementing components, sub-components, methods and sub-methods, it should be readily apparent that a number of modifications may be made without departing from the spirit thereof and that these implementations, implementing components, sub-components, methods and sub-methods may be applied to other semiconductor substrate processing method implementations.

What is claimed is:

1. A method of forming a plurality of semiconductor devices on a semiconductor substrate, the method comprising:
   providing a semiconductor substrate comprising a first surface, a second surface, a size, and a thickness where the second surface opposes the first surface and the thickness is between the first surface and the second surface; and
   processing the semiconductor substrate through a plurality of semiconductor device fabrication processes to form a plurality of semiconductor devices on the first surface;
   wherein the thickness is between 70 microns and 200 microns and the size is 100 millimeters;
   wherein the thickness is a pre-processed thickness prior to forming the plurality of semiconductor devices on the first surface; and
   wherein the semiconductor substrate is configured to directly couple to a chuck during the processing of the semiconductor substrate.

2. The method of claim 1, further comprising backgrinding the second surface of the semiconductor substrate to reduce the thickness to a desired value.

3. The method of claim 1, further comprising singulating the semiconductor substrate to singulate the plurality of semiconductor devices.

4. The method of claim 1, wherein providing the semiconductor substrate further comprises:
   forming the semiconductor substrate from a boule; and
   one of grinding and polishing one of the first surface or the second surface of the semiconductor substrate to thin the thickness to between 70 microns and 200 microns.

5. The method of claim 1, wherein providing the semiconductor substrate further comprises:
   forming the semiconductor substrate from a boule with the thickness between 70 microns and 200 microns; and
   one of grinding and polishing one of the first surface or the second surface to flatten one of the first surface or the second surface.

6. The method of claim 1, wherein the thickness is between 70 microns and 200 microns during each of the plurality of semiconductor device fabrication processes.

7. A method of forming a plurality of semiconductor devices on a semiconductor substrate, the method comprising:
   providing a semiconductor substrate comprising a first surface, a second surface, a size, and a thickness where the second surface opposes the first surface and the thickness is between the first surface and the second surface; and processing the semiconductor substrate through a plurality of semiconductor device fabrication processes to form a plurality of semiconductor devices on the first surface;

wherein the thickness is between 100 microns and 575 microns and the size is 150 millimeters;

wherein the thickness is a pre-processed thickness prior to forming the plurality of semiconductor devices on the first surface; and wherein the semiconductor substrate is self-supporting during the processing.

8. The method of claim 7, further comprising backgrinding the second surface of the semiconductor substrate to reduce the thickness to a desired value.

9. The method of claim 7, further comprising singulating the semiconductor substrate to singulate the plurality of semiconductor devices.

10. The method of claim 7, wherein providing the semiconductor substrate further comprises:
forming the semiconductor substrate from a boule; and
one of grinding and polishing one of the first surface or the second surface of the semiconductor substrate to thin the thickness to between 100 microns and 575 microns.

11. The method of claim 7, wherein providing the semiconductor substrate further comprises:
forming the semiconductor substrate from a boule with the thickness between 100 microns and 575 microns; and
one of grinding and polishing one of the first surface or the second surface to flatten one of the first surface or second surface.

12. The method of claim 7, wherein the thickness is between 100 microns and 575 microns during each of the plurality of semiconductor device fabrication processes.

13. A method of forming a plurality of semiconductor devices on a semiconductor substrate, the method comprising:
providing a semiconductor substrate comprising a first surface, a second surface, a size, and a thickness where the second surface opposes the first surface and the thickness is between the first surface and the second surface; and processing the semiconductor substrate through a plurality of semiconductor device fabrication processes to form a plurality of semiconductor devices on the first surface;

wherein the thickness is between 120 microns and 600 microns and the size is 200 millimeters;

wherein the thickness is a pre-processed thickness prior to forming the plurality of semiconductor devices on the first surface; and wherein the semiconductor substrate is self-supporting during the processing.

14. The method of claim 13, further comprising backgrinding the second surface of the semiconductor substrate to reduce the thickness to a desired value.

15. The method of claim 13, further comprising singulating the semiconductor substrate to singulate the plurality of semiconductor devices.

16. The method of claim 13, wherein providing the semiconductor substrate further comprises:
forming the semiconductor substrate from a boule; and
one of grinding and polishing one of the first surface or the second surface of the semiconductor substrate to thin the thickness to between 120 microns and 600 microns.

17. The method of claim 13, wherein the thickness is between 120 microns and 600 microns during each of the plurality of semiconductor device fabrication processes.

* * * * *